(12) United States Patent
Mead et al.

(10) Patent No.: US 7,702,973 B2
(45) Date of Patent: Apr. 20, 2010

(54) MODIFIED DEFECT SCAN OVER SYNC MARK/PREAMBLE FIELD

(75) Inventors: John P. Mead, Longmont, CO (US); Bahjat Zafer, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 551 days.

(21) Appl. No.: 11/786,981

(22) Filed: Apr. 13, 2007

(65) Prior Publication Data

US 2008/0168315 A1 Jul. 10, 2008

Related U.S. Application Data

(60) Provisional application No. 60/879,203, filed on Jan. 5, 2007.

(51) Int. Cl.
*G11C 29/00* (2006.01)
*G06F 11/00* (2006.01)
*G11B 27/36* (2006.01)
*G11B 5/09* (2006.01)

(52) U.S. Cl. ............... 714/723; 714/8; 714/25; 714/42; 714/54; 714/719; 369/53.17; 369/53.32; 369/53.35; 369/53.44; 360/31; 360/39; 360/53

(58) Field of Classification Search .......... 714/8, 714/25, 30, 42, 54, 719, 723; 360/31, 39, 360/53; 369/53.17, 53.32, 53.35, 53.44
See application file for complete search history.

(56) References Cited

U.S. PATENT DOCUMENTS

| 4,955,022 | A | * | 9/1990 | Odaka | 714/755 |
| 5,818,654 | A | * | 10/1998 | Reddy et al. | 360/53 |
| 5,844,919 | A | * | 12/1998 | Glover et al. | 714/769 |
| 5,872,800 | A | * | 2/1999 | Glover et al. | 714/766 |
| 6,295,176 | B1 | * | 9/2001 | Reddy et al. | 360/48 |
| 6,310,739 | B1 | * | 10/2001 | McEwen et al. | 360/25 |
| 7,280,295 | B2 | * | 10/2007 | Dati et al. | 360/51 |
| 2008/0010509 | A1 | * | 1/2008 | Southerland et al. | 714/8 |

FOREIGN PATENT DOCUMENTS

WO      WO 01/31651 A1 * 10/1999

* cited by examiner

*Primary Examiner*—John J Tabone, Jr.
(74) *Attorney, Agent, or Firm*—Garlick Harrison & Markison (57) ABSTRACT

A technique to detect defects when reading a defect scan pattern stored on a disk in which the detected defects are processed differently depending on which region of a sector the defect is resident. In one implementation, a mask is used to identify the defects of different regions. By differentiating different regions within the sector for defect scan, sync mark and preamble fields may be treated as critical regions so that different defect scan properties may be attributed when performing the defect scan.

10 Claims, 8 Drawing Sheets

MODIFIED DEFECT SCAN OVER SYNC MARK/PREAMBLE FIELD

CROSS REFERENCE TO RELATED APPLICATION

This application claims the benefit of priority to U.S. Provisional Patent Application Ser. No. 60/879,203; filed Jan. 5, 2007; and titled "Modified defect scan over sync mark/preamble field," which is incorporated herein by reference.

BACKGROUND OF THE INVENTION

1. Technical Field of the Invention

The embodiments of the invention relate generally to disk drives and, more particularly, to providing different defect processing to different portions of information read from a disk medium during a defect scan.

2. Description of Related Art

Varieties of memory storage devices, such as magnetic disk drives, are available to store data and are used to provide data storage for a host device, either directly, or through a network. Those networks may be a storage area network (SAN) or a network attached storage (NAS). Typical host devices include stand alone computer systems such as a desktop or laptop computer, enterprise storage devices such as servers, storage arrays such as a redundant array of independent disk (RAID) arrays, storage routers, storage switches and storage directors, and other consumer devices such as video game systems and digital video recorders. These devices generally provide high storage capacity in a cost effective manner.

One class of disk storage devices uses magnetic media to store information. In order to ensure that digital data is written to the disk and retrieved correctly, it is desirable to have defect-free media. However, manufacturing processes are not ideal and defects are introduced in the manufactured media. For example, one type of defect is caused by having a reduction of magnetic material on a medium below a specified value. Such reduction of magnetic material may cause a lower signal amplitude, which may result in a "dropout" condition. Alternatively, another type of defect is caused by having excess magnetic material on a medium above a specified value. Such increase of magnetic material may cause a higher signal amplitude, which may result in a "dropin" condition. Either defect condition may cause a bit or bits to be stored in an incorrect state when written to the medium and/or read incorrectly from the medium.

In order to address manufacturing defects of the types noted above, as well as other defects, a typical practice for disk manufacturers is to perform a defect scan to map defective sectors after the disk is manufactured. Generally, a defect scan entails writing a known test pattern on the disk, reading the stored bits and comparing the read bits to the known test pattern to determine sectors (or tracks) that contain defects. A defect mapping is then performed to identify those sectors (or tracks) that contain defects that are not acceptable. The defective sectors are then placed in a defect scan table and these sectors are not used for data storage when logical addresses are mapped to physical addresses on the disk to store data.

Although the above-described technique allows defect mapping to identify defective sectors (or tracks) on a medium, all scannable regions of the disk are treated the same, so that no differentiation is made between critical regions of a sector from less critical regions of the sector. For example, preamble and sync mark fields are generally regarded as more critical than user data fields, since user data may be further processed by an error correction mechanism, such as error correction code (ECC) to correct for errors. That is, more errors are generally tolerated with data fields, as compared to preamble and sync mark fields. However, no such distinction is made when the disk is scanned for defects. Depending on the defect threshold set for the scan, this uniform scanning technique results in 1) mapping out too many sectors on a disk drive, which may ultimately result in lower yield issues in the factory; or 2) having drive returns due to bad sync mark/preamble fields in which sectors are not mapped out when they should have been.

Accordingly, there is a need for another technique to perform a defect scan, in which different defect criteria may be set dependent on the type of information being read. By having different defect scan levels, critical regions of a disk may be treated differently from less critical regions when identifying the defects.

SUMMARY OF THE INVENTION

The present invention is directed to apparatus and methods of operation that are further described in the following Brief Description of the Drawings, the Detailed Description of the Embodiments of the Invention, and the Claims. Other features and advantages of the present invention will become apparent from the following detailed description of the embodiments of the invention made with reference to the accompanying drawings.

DETAILED DESCRIPTION OF THE EMBODIMENTS OF THE INVENTION

The embodiments of the present invention may be practiced in a variety of settings that implement a disk drive, such as a hard disk drive (HDD), or other memory storage devices that utilize a defect scan. Although the technique described below pertains to disk drives utilizing a magnetic medium, it need not be limited to magnetic medium. Furthermore, the example described below identifies the preamble and sync mark fields as critical areas, but other embodiments may define other portions of the disk area as critical areas for defect scan analysis.

Figure 1:
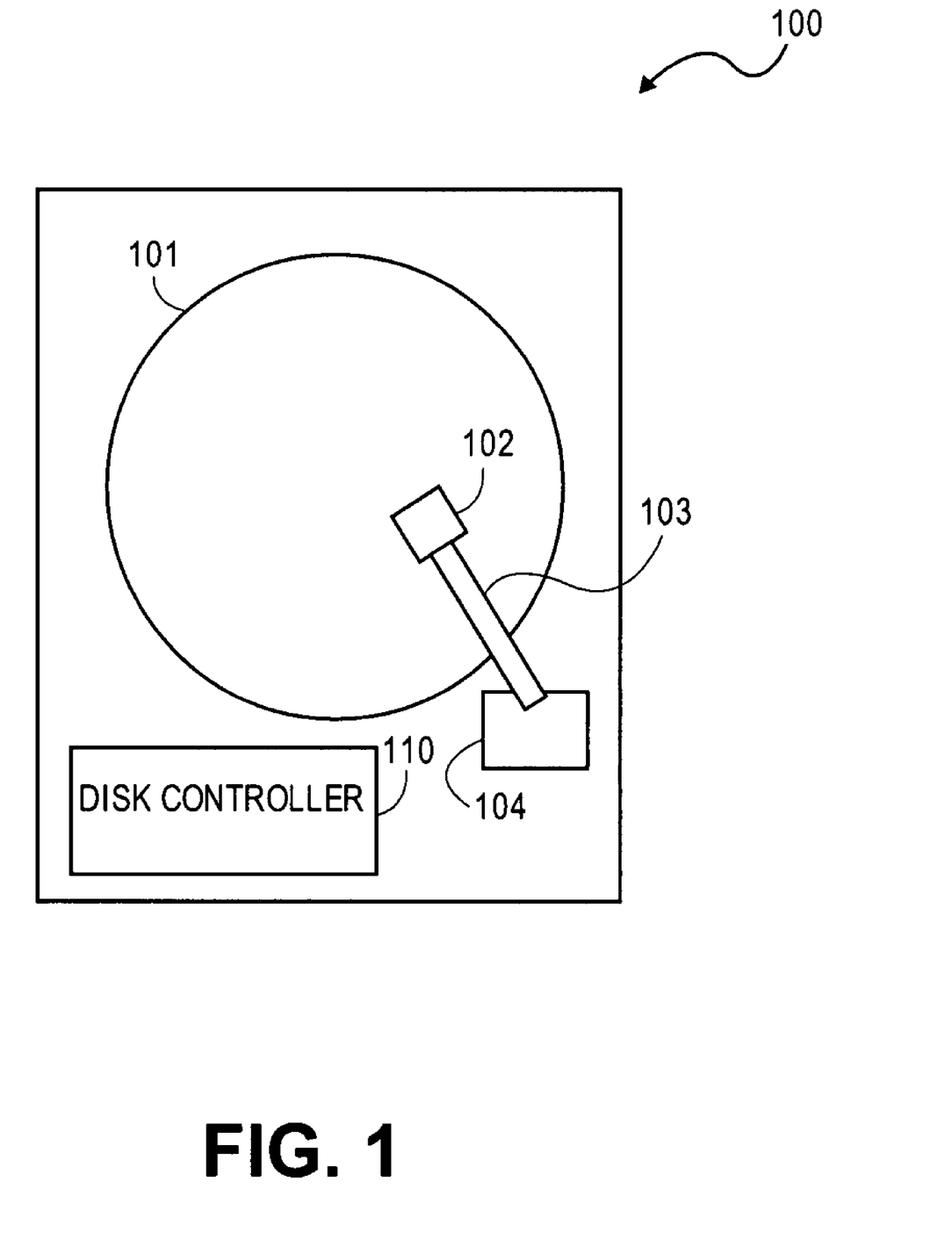
FIG. 1 shows an embodiment of a disk drive device for practicing the invention.

FIG. 1 illustrates an example embodiment of a disk drive 100 for practicing an embodiment of the invention. In particular, disk drive 100 is a HDD device that includes a disk 101 to store data. Disk 101 is typically rotated by a servo or motor (not shown) at a specified velocity depending on a particular application for its use. Disk 101 may be constructed from various materials and in one embodiment disk 101 is a magnetic disk that stores information as magnetic field changes on some type of magnetic medium. The medium may be rigid or non-rigid, although HDD devices generally have rigid disks. Disk 101 may be removable or non-removable. Disk 101 typically is made of magnetic material or coated with magnetic material. It is to be noted that in other embodiments, disk 101 may employ other data storage technology, such as an optical medium, and need not be limited to magnetic storage.

Disk drive 100 typically includes one or more read/write heads 102 that are coupled to an arm 103 that is moved by an actuator 104 over the surface of the disk 101 either by translation, rotation or both. Disk drive 100 may have one disk 101, or multiple disks with multiple read/write heads 102. Disk drive 100 includes a disk controller module 110 that is utilized for controlling the operation of the disk drive, including read and write operations to disk 102, as well as controlling the speed of the servo motor and the motion of actuator 104. Disk controller module 110 may also include an interface to couple to an external device, such as a host device. It is to be noted that disk drive 100 is but one example and other disk drives may be readily implemented to practice various embodiments of the invention.

Disk drive 100, or any other equivalent disk drive, may be implemented in a variety of devices. For example, disk drive 100 may be implemented in a handheld unit, such as a handheld audio unit. In one such embodiment, disk drive 100 may include a small form factor magnetic disk and incorporated into or otherwise used by handheld audio unit to provide general storage, including storage of audio content.

In another example embodiment, disk drive 100 may be implemented in a computer. In one such embodiment, disk drive 100 may include a magnetic disk for various applications, including enterprise storage applications. Disk drive 100 may be incorporated into or otherwise used by a computer to provide general purpose storage and the computer may be attached to a storage array, such as a redundant array of independent disks (RAID) array, storage router, edge router, storage switch and/or storage director. Disk drive 100 may be implemented in a variety of computers (or computing devices), such as desktop computers and notebook computers.

In another example embodiment, disk drive unit 100 may be implemented in a wireless communication device to provide general storage. In one such embodiment, the wireless communication device may communicate via a wireless telephone network such as a cellular, personal communications service (PCS), general packet radio service (GPRS), global system for mobile communications (GSM), integrated digital enhanced network (iDEN) or other wireless communications network capable of sending and receiving telephone calls. Furthermore, the wireless communication device may communicate via the Internet to access email, download content, access websites, and provide streaming audio and/or video programming. In this fashion, the wireless communication device may place and receive telephone calls, text messages, short message service (SMS) messages, pages and other data messages that may include attachments such as documents, audio files, video files, images and other graphics.

Still as another example, disk drive 100 may be implemented in the personal digital assistant (PDA). In one such embodiment, disk drive 100 may include a small form factor magnetic hard disk to provide general data storage. Still in another embodiment, disk drive 100 may be implemented in a television set (such as a high-definition television) or a digital video recorder to store video information.

In these various embodiments for disk drive 100, a variety of data, as well as program instructions, may be stored. Stored data may include, and is not limited to, general data, data for motion picture expert group (MPEG) audio layer 3 (MP3) files or Windows Media Architecture (WMA) files, video content such as MPEG4 files, JPEG (Joint Photographic Expert Group) files, bitmap files and files stored in other graphics formats, emails, webpage information and other information downloaded from the Internet, address book information, and/or any other type of information that may be stored on a disk medium.

Figure 2:
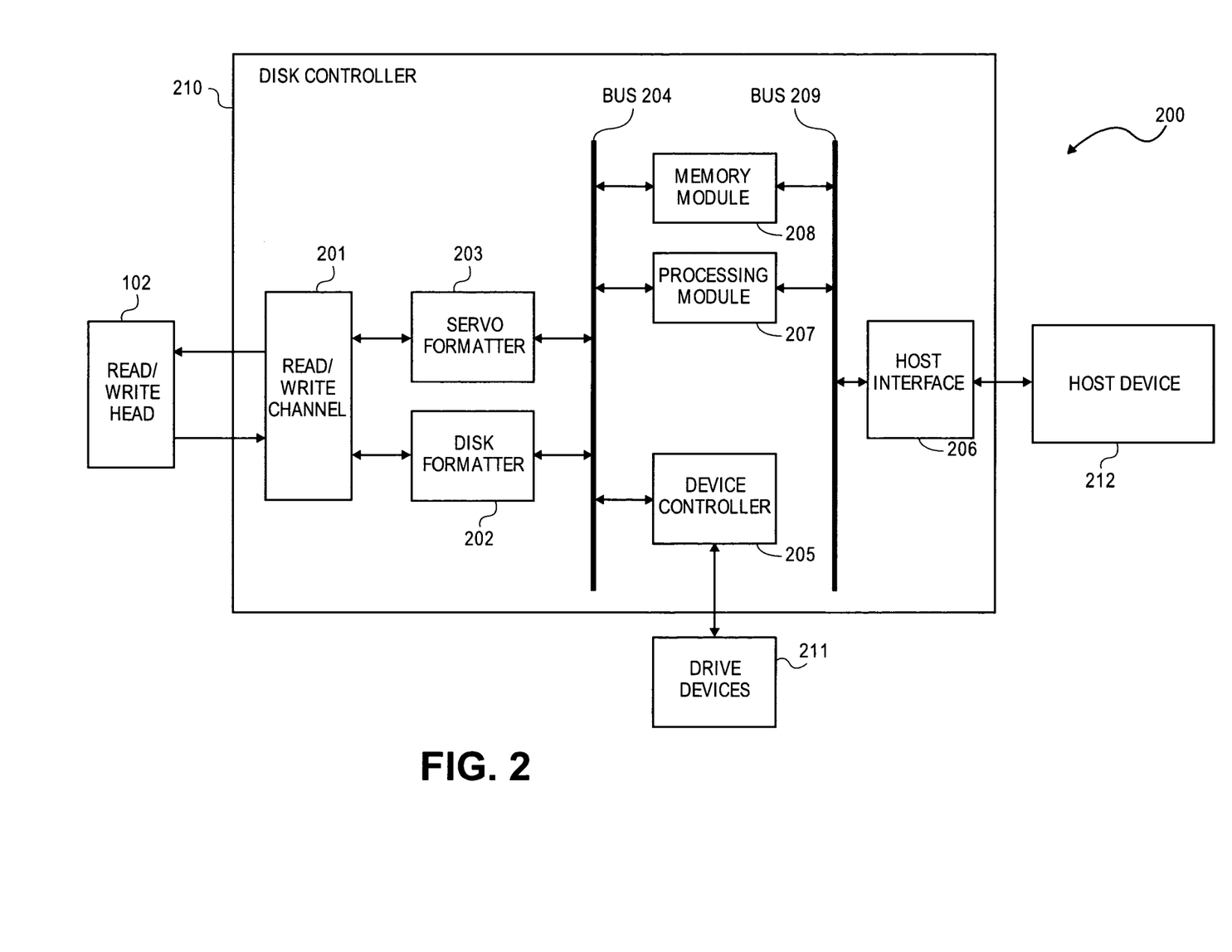
FIG. 2 shows one embodiment of an apparatus that has a disk controller that implements the invention.

FIG. 2 illustrates an embodiment of an apparatus 200 that may be implemented with disk drive 100 of FIG. 1. Read/write head 102 is shown coupled to a disk controller 210, which may be used for disk controller 110 of FIG. 1. In the particular embodiment, disk controller 210 includes a read/write channel 201 coupled to head 102 for reading and writing data to and from disk 101. A disk formatter 202 is included for controlling the formatting of data and provides clock signals and other timing signals that control the flow of the data written to and data read from disk 101 through read/write channel 201. A servo formatter 203, also coupled to read/write channel 201, provides clock signals and other control and timing signals based on servo control data read from disk 101. Disk formatter 202 and servo formatter 203 are also coupled to bus 204. Disk controller 210 further includes a device controller 205, host interface 206, processing module 207 and memory module 208, as well as a second bus 209. Device controller 205 controls the operation of one or more drive device(s) 211. Device(s) 211 may be one or more device(s) such as actuator 104 and the servo (or spindle) motor used to rotate disk 101. Host interface 206 is coupled between bus 209 and a host device 212 to receive commands from host device 212 and/or transfer data between host device 212 and disk 101 in accordance with a particular protocol.

Processing module 207 may be implemented using one or more microprocessors, micro-controllers, digital signal processors, microcomputer processing units, field programmable gate arrays, programmable logic devices, state machines, logic circuits, analog circuits, digital circuits, and/or any device that manipulates signal (analog and/or digital) based on operational instructions. The operational instructions may reside in memory module 208 or may reside elsewhere. When processing module 207 is implemented with two or more devices, each device may perform the same steps, processes or functions in order to provide fault tolerance or redundancy. Alternatively, the function, steps and processes performed by processing module 207 may be split between different devices to provide greater computational speed and/or efficiency.

Memory module 208 may be a single memory device or a plurality of memory devices. Such a memory device may be a read-only memory (ROM), random access memory (RAM), volatile memory, non-volatile memory, static random access memory (SRAM), dynamic random access memory (DRAM), flash memory, cache memory, and/or any device that stores digital information. It is to be noted that when processing module 207 implements one or more of its functions via a state machine, analog circuitry, digital circuitry, and/or logic circuitry, memory module 208 storing the corresponding operational instructions may be embedded within, or reside external to, the circuitry comprising the state machine, analog circuitry, digital circuitry, and/or logic circuitry. Furthermore, memory module 208 stores, and the processing module 207 executes, operational instructions that may correspond to one or more of the steps or a process, method and/or function described herein.

Each of these elements of controller 210 may be implemented in hardware, firmware, software or a combination thereof, in accordance with the broad scope of the present invention. While a particular bus architecture is shown in FIG. 2 with buses 204, 209, alternative bus architectures that include either a single bus configuration or additional buses are likewise possible to be implemented as different embodiments.

In one embodiment, one or more modules of disk controller 210 are implemented as part of a system on a chip (SoC) integrated circuit. In the particular embodiment shown, disk controller 210 is part of a SoC integrated circuit that may include other circuits, devices, modules, units, etc., which provide various functions such as protocol conversion, code encoding and decoding, power supply, etc. In other embodiments, the various functions and features of disk controller 210 may be implemented in a plurality of integrated circuits that communicate and combine to perform the functionality of disk controller 210.

When the drive unit 100 is manufactured, disk formatter 203 generally writes a plurality of servo wedges along with a corresponding plurality of servo address marks at radial distance along the disk 101. The servo address marks are used by the timing generator for triggering a "start time" for various events employed when accessing the medium of the disk 101. Generally, these servo address marks are used to separate a particular track of the disk into a number of sectors for formatting the disk.

Figure 8:
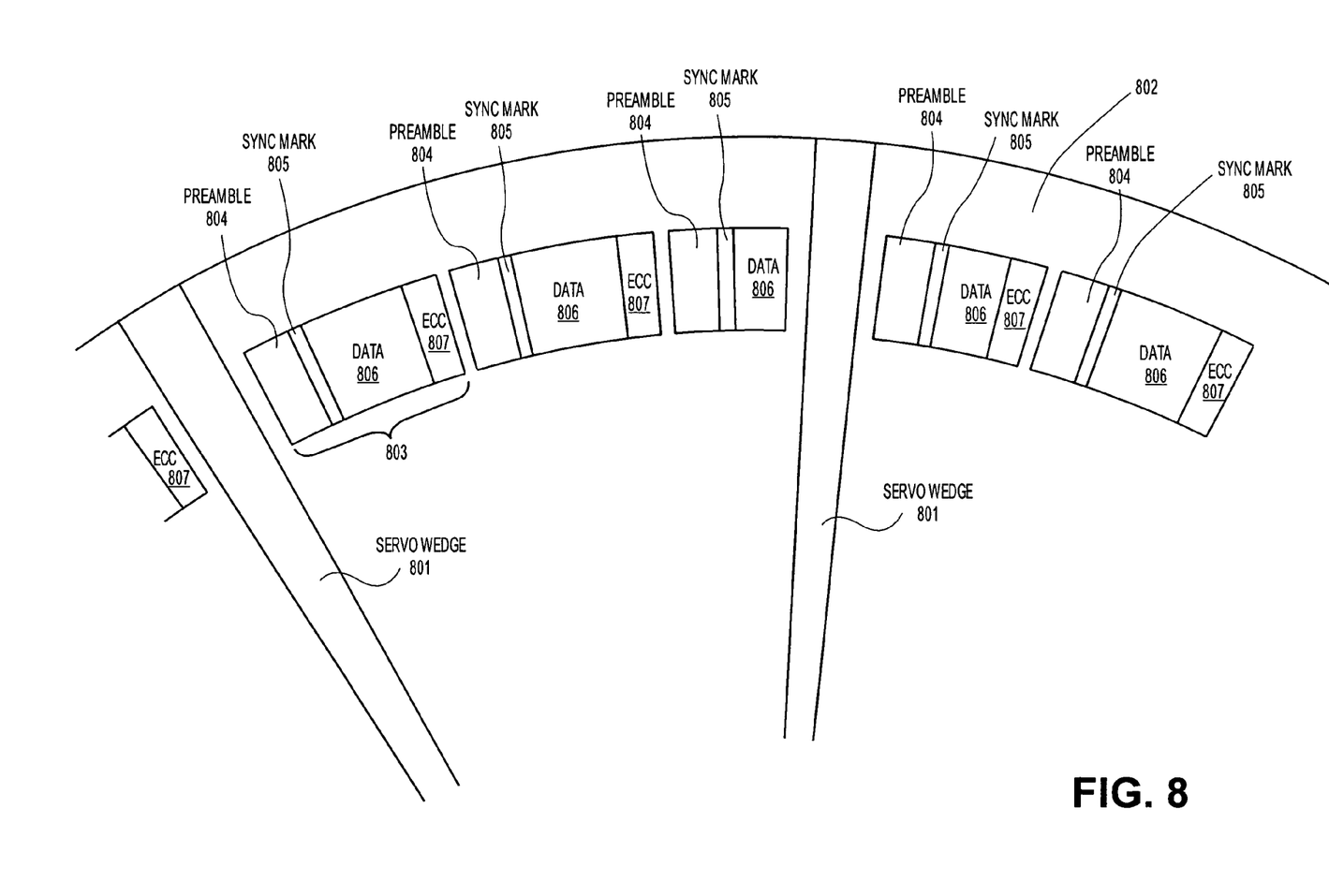
FIG. 8 shows an example of a disposition of multiple sectors on one track of a disk.

Although a disk may use a variety of formatting schemes, FIG. 8 illustrates one example of a track 800 on a disk 802 in which servo wedges 801 are used to divide the disk. One or more sectors 803 reside between the servo sedges 801. In the particular example shown in FIG. 8, each sector 803 includes a preamble 804, sync mark 805 and user data 806. In some instances error correction code (ECC) 807, or some equivalent, 807 may be included along with data 806. A typical sector size is 512 bytes, but other sizes may apply. Sectors need not be limited to 512 bytes. Furthermore, some sectors may bridge across a servo wedge, in which instance, another preamble/sync mark fields are used before continuing with the data.

Similarly, various schemes may be implemented to transfer the data to and from the disk, in which preamble and sync mark fields are used as guides for reading the data from a start of the sector. For example, a symbol is a term used to identify the smallest element of user data that is transferred between a controller and a channel during a disk transfer. In today's disk drive systems, symbol sizes range from 8-bits to 12-bits, however other sizes may be applicable. Thus, in one embodiment, 8-bit symbols (or alternatively, 12-bit symbols) are used to transfer 512 bytes of a sector.

For defect scans, in one embodiment of the invention, a 2T (a pattern having a bit string of 1100 1100) defect scan scheme is implemented, in which multiple defect scan errors are reported to a controller by a channel on a symbol basis. However, other defect scan schemes using other patterns, or even random bit strings, may be used as well.

As noted in the Background section above, when a disk is manufactured, a defect scan may be performed to identify defects on the disk. When defect tolerances are exceeded for a region (such as a sector), the region is mapped to build a table to identify unacceptable defective regions on the medium. The defective regions identified in this defect scan table are not used to store data. Prior art defect scan techniques perform the same scan over the various regions of the disk without making a distinction for the region being scanned. In practicing the various embodiments of the invention, instead of performing the same defect scan over all scannable regions, one or more regions are treated differently for the defect scan. That is, different defect scan criteria are attributed to different regions of the disk. In one embodiment, one region is masked to have a different set of defect scan criteria over another region.

Figure 3:
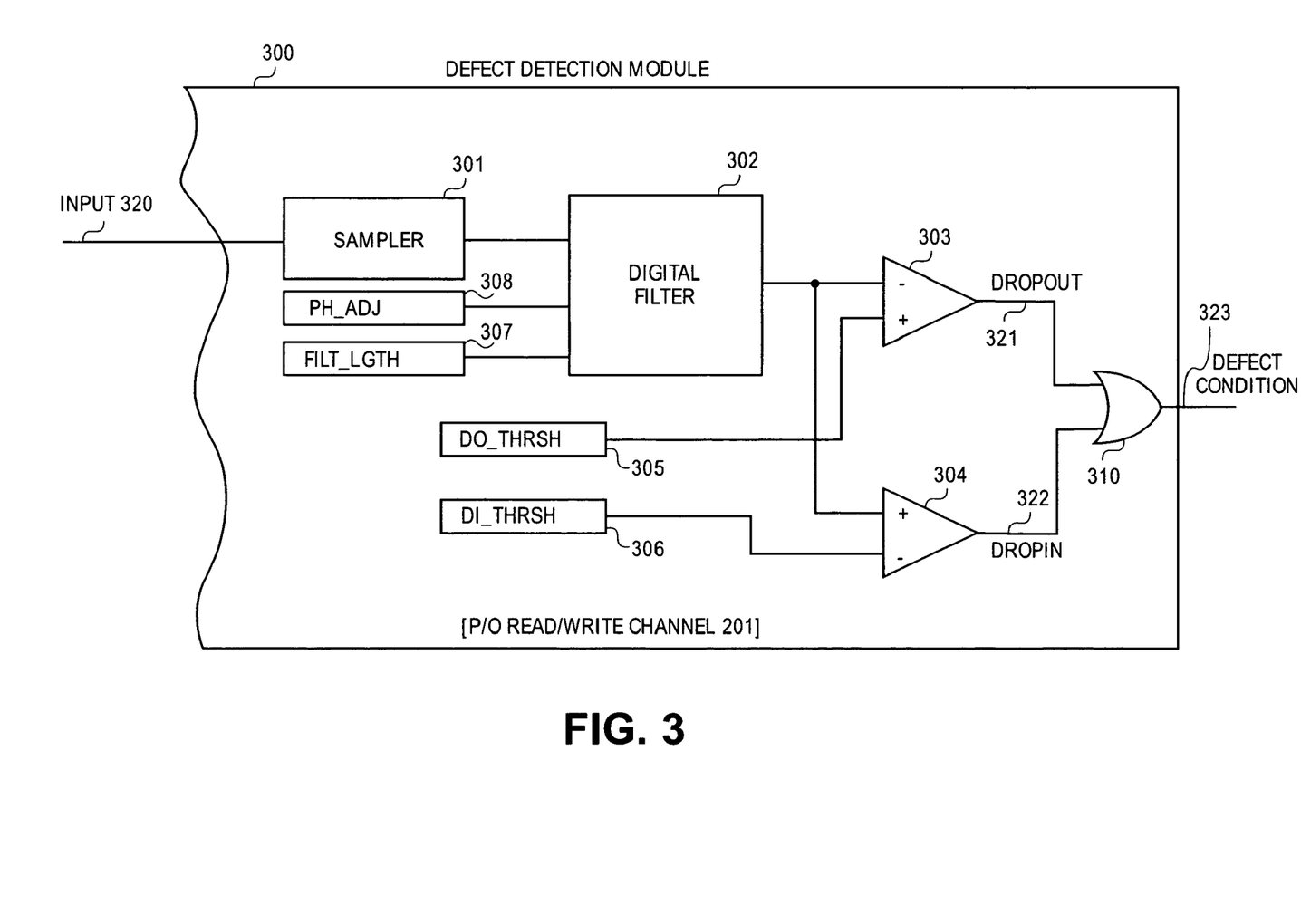
FIG. 3 shows a portion of a read/write channel of a disk controller that includes one embodiment of a defect detection module.

FIG. 3 shows one embodiment of a defect detection module 300, which is used to detect a possible defect on a disk medium. Defect detection module 300 is shown as part of read/write channel 201 in the particular example shown, but module 300 need not be limited to the read/write channel 201. Defect detection module 300 may be placed within disk formatter 202, another component or module, or may even be a separate unit. However, as shown in the example of FIG. 3, defect detection module 300 resides within read/write channel 201 to receive data input from read/write head 102. Data input 320 from read/write head 201 is typically in analog format, but may be in other formats as well for other embodiments.

When a defect scan is to be performed, a pattern (such as the afore-mentioned 2T pattern) is written to the disk first. The disk is then read during a defect scan mode to detect errors in the information read. When the defect scan mode is enabled, the incoming data from the disk is coupled to defect detection module 300 as input 320. A variety of defect detection schemes may be applied to input 320, including prior art techniques. FIG. 3 shows one embodiment in which a dropout condition and a dropin condition are detected. Generally, defect detection module 300 performs defect detection on a symbol-basis, but other embodiments may perform defect scan on other groupings of bits read from the disk medium.

Input 320 is coupled to a sampler unit 301 to sample the input. Sampler 301 may include an analog-to-digital converter (ADC) unit to convert the input data from analog to digital form. The sampled input is then coupled to a digital filter 302. Filter 302 is employed to filter the sampled signal in order to generate a filtered signal that corresponds to an amplitude level. An output from digital filter 302 is coupled to an input of comparator 303 and to an input of comparator 304.

Comparator 303 sets a dropout threshold level (DO_THRSH) so that when the amplitude of the output from filter 302 drops below this level, the comparator output changes state to indicate a dropout condition (DROPOUT) at output 321. Similarly, if filter 302 output increases above a dropin threshold level (DI_THRSH), set at comparator 304, comparator 304 output changes state to indicate a dropin condition (DROPIN) at output 322. Thus, whenever a dropin and/or dropout conditions are detected during a scan, respective DROPIN and DROPOUT signals from defect detection module 300 signify a detection of a defect condition. The DROPIN and DROPOUT signals are OR'ed through OR gate 310 to generate the defect condition signal at output 323. As will be noted below, the signal at output 323 is used to identify a defect condition, which is provided to a defect detection module, such as the one shown in FIG. 5. In one embodiment, defect condition signal at output 323 is provided to disk formatter 202 on a NRZ (non-return-to-zero) bus.

As noted in FIG. 3, the dropout threshold level is set for comparator 303 by a stored DO_THRSH value. Although DO_THRSH may be fixed, having a storage medium, such as a programmable register 305, allows the dropout threshold to be changed. Similarly, the dropin threshold level is set for comparator 304 by programmable register 306 to allow DI_THRSH to be changed.

Furthermore, programmable register 307 holds a filter length value (FILT_LGTH) and programmable register 308 holds phase adjust value (PH_ADJ). In one embodiment, FILT_LGTH is used to set the length of the filter selected for digital filter 302 and PH_ADJ is used to adjust the phase of filter 302. Both these adjustments are further described in FIG. 4.

It is to be noted that the defect condition signal at output 323 corresponds to whatever granularity that is used for sampling the input 320. If the sample granularity is a symbol of x-bits, then each output signal 323 corresponds to identifying a defect condition for those x-bits. The granularity need not be limited to bit streams and in other embodiments, the granularity of the sampled data may be in other forms, such as packets.

Figure 4:
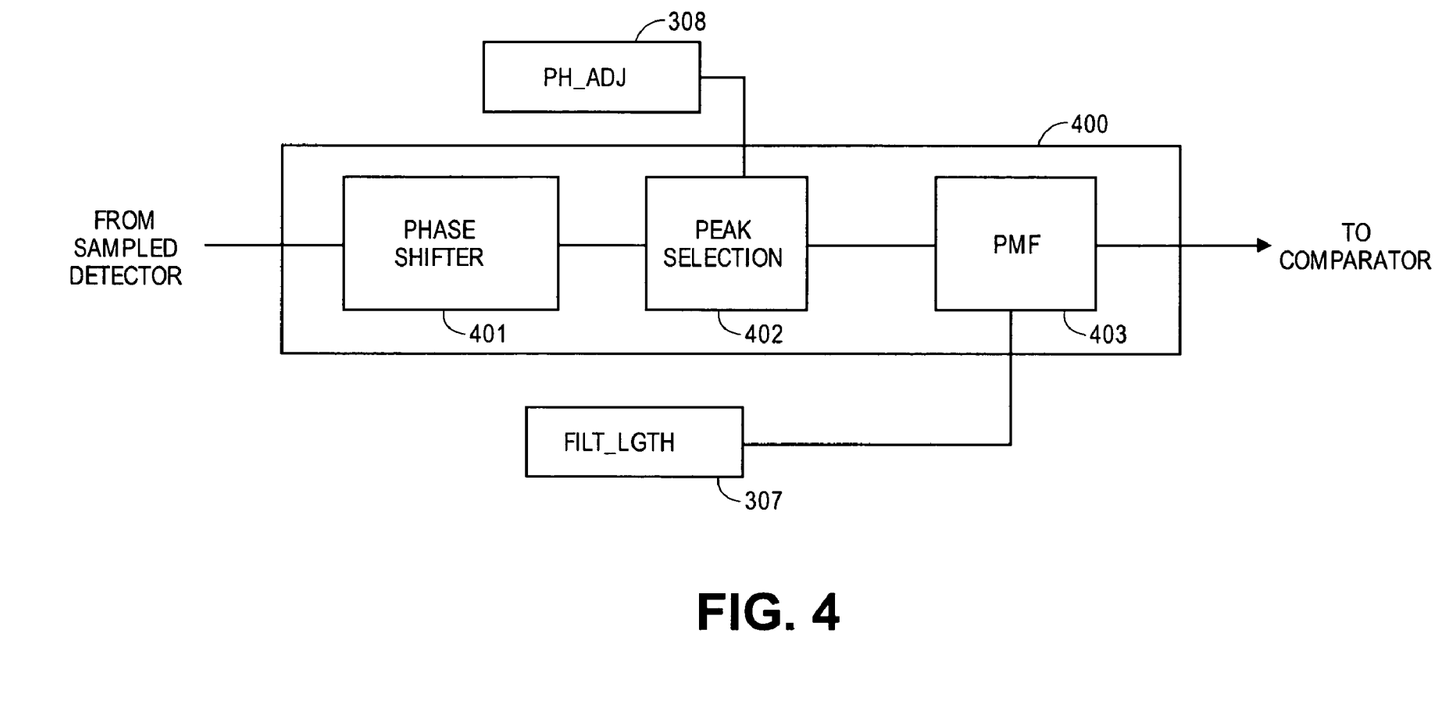
FIG. 4 shows one embodiment of a digital filter used in the defect detection module of FIG. 3.

FIG. 4 shows one embodiment for implementing digital filter 302. It is to be noted that a variety of filters may be implemented for filter 302 and that the particular embodiment shown in FIG. 4 is but one example. Thus, digital filter 400 of FIG. 4 may be implemented as one embodiment for filter 302 of FIG. 3. Filter 400 includes a phase shifter 401, peak selection unit 402 and preamble matched filter (PMF) 403. Phase shifter 401 is a general multi-tap finite impulse response (FIR) filter (2-taps in one embodiment) which operates on the input signal to generate output in peak-to-peak format. Peak selection unit 402 uses the phase information PH_ADJ from register 308 to shift the signal so that the signal to PMF starts on a peak (positive peak in one embodiment). PMF 403 supports filtering of various length symbols and the bit length to be filtered is determined by the value FILT_LGTH of register 307. In one embodiment, PMF 403 is comprised of two separate filters; one to support filtering for dropout and the second to support filtering for dropin. In one embodiment, filter 400 is set to read the 2T pattern read from the disk.

In reference to FIGS. 3 and 4, the particular embodiment shown is for exemplary purpose only and that many other defect detections schemes, whether using digital filtering or some other device, may be implemented to identify one or more defects. Furthermore, the defects to be detected need not be limited to dropin and dropout conditions associated with the medium. Other defects may be detected. For example, transient voltage aberrations may be detected using thermal asperity (TA) defect detection schemes. Additionally, dropin and/or dropout defects may be further categorized into dropin/dropout of certain duration, such as short dropout or medium-long dropout. Thus, various combinations of defect detection may be implemented to detect defects when a stored information is read from the medium. What is important is that some form of defect detection occurs with defect detection module 300 so that a defect condition or error signal is sent to the following defect scan stage.

Figure 5:
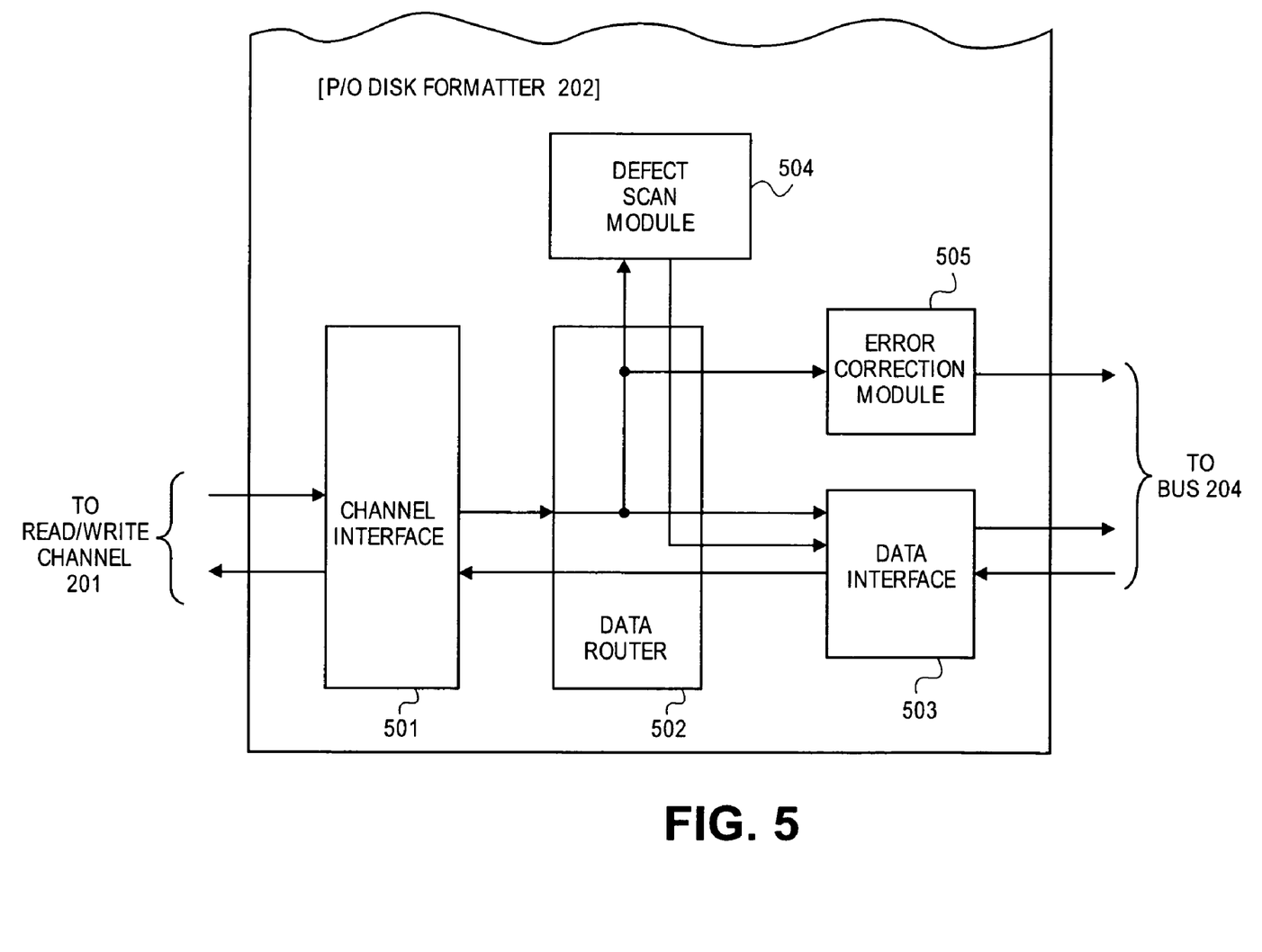
FIG. 5 shows one embodiment of a portion of a disk formatter which includes a defect scan module.

FIG. 5 shows part of disk formatter 202, which includes defect scan module 504. It is to be noted that, although defect scan module 504 is shown as part of disk formatter 202, module 504 may be located elsewhere or it may be a stand alone unit. Disk formatter 202 also includes a channel interface 501, data router 502, error correction module 505 and data interface 503. Channel interface 501 provides the interface coupling for data transfer between disk formatter 202 and read/write channel 201. Data router 502 routes data between channel interface 501 and data interface 503 during normal operation. Data interface 503 provides the interface coupling for data transfer between disk formatter 202 and the remainder of the disk controller. In some instances, read data may be coupled to error correction module 505 so that ECC operations may be performed prior to coupling the read data to bus 204.

When in the defect scan mode of operation, data router 502 receives the defect detection information and routes the defect information to defect scan module 504. In some embodiments, the defect condition output from defect detection module 300 may be directly coupled to defect scan module 504. What is important is that defect scan module 504 is controlled in real time by hardware or firmware that has knowledge of the particular format of the current data track. Thus, timing of defect scan module 504 is synchronized with the data being transferred, as well as the defect condition information, so that defect conditions may be correlated to a particular granularity of information stored on the disk. Defect scan module 504 also receives disk format information as to the start of a particular region, for example, the start of a preamble or a sync mark. Also, defect scan module 504 is provided information based on the drive format to establish what it regards as a critical region (CR). In the particular example, the critical regions are identified as the preamble field and sync mark field of the read information (hereinafter, the preamble field and the sync mark field are noted together as sync mark/preamble fields), such as preamble 804 and sync mark 805 of FIG. 8. The other region or regions, namely the user data fields, are to be regarded as non-critical (NC) regions. Defect scan module 504 then uses this field identifying information to set various masks for the different regions. The mask or masks determine the type of defect analysis that may be performed on the respective region.

Figure 6:
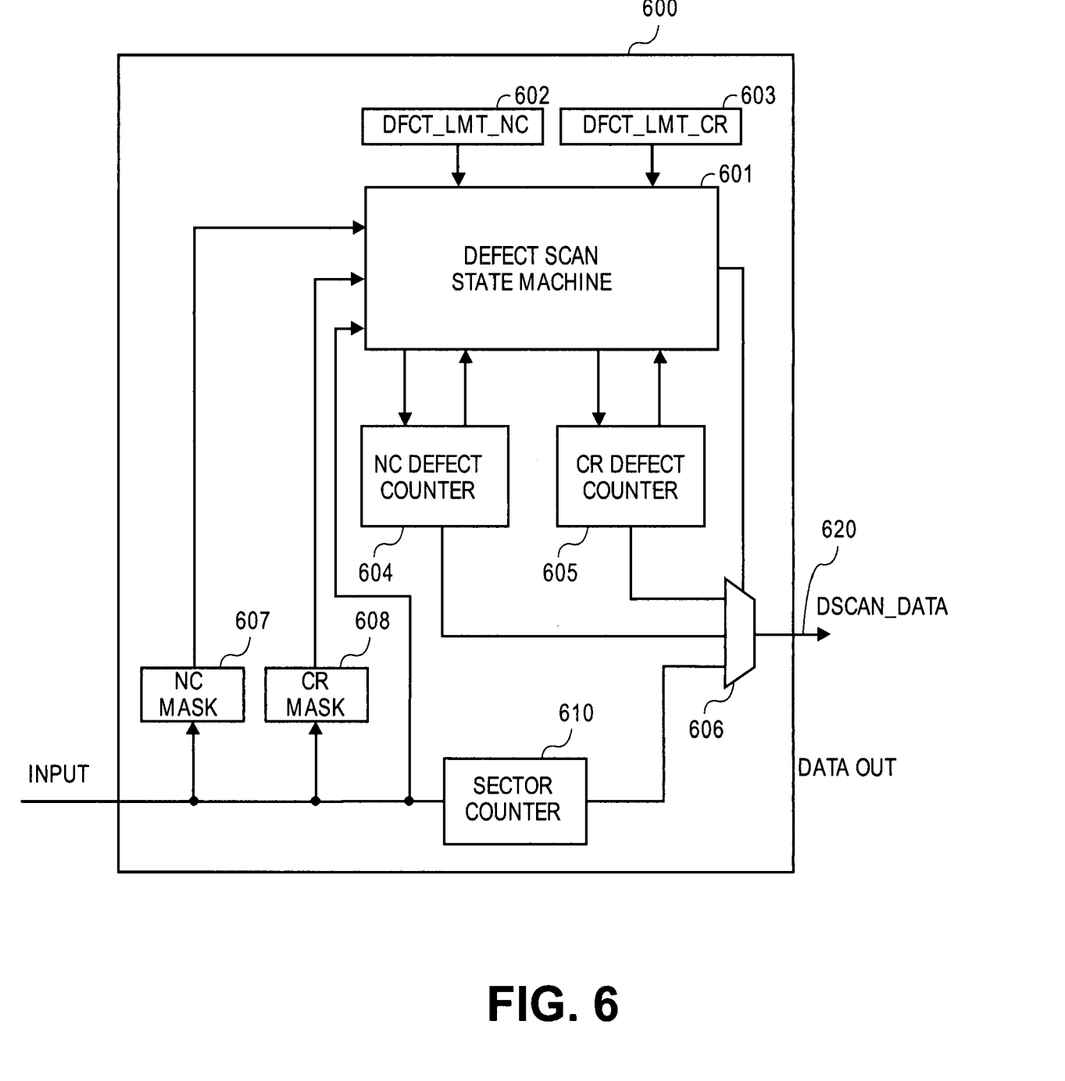
FIG. 6 shows one embodiment for implementing the defect scan module of FIG. 5.

FIG. 6 shows one embodiment for implementing defect scan module 504 of FIG. 5. It is to be noted that various other embodiments may be implemented and the invention is not limited to the embodiment of FIG. 6. Defect scan module 600, which may be used for defect scan module 504 of FIG. 5, includes a defect scan state machine 601 to perform the defect scan analysis on the defect information provided by defect detection module 300. As described above for defect scan module 504, information is provided to module 600 also based on the drive format to synchronize module 600 to the data transfer and to identify the different components of the transferred information. Module 600 then selects what it regards as the critical region. As noted above, in one embodiment the critical region is comprised of the preamble field and the sync mark field. The remaining region(s) is/are regarded as non-critical. Thus two separate regions (CR and NC) are thus selected from the information read from the disk. The detected defect condition information is coupled to state machine 601 via a NC mask 607 and CR mask 608.

When a defect scan is commenced, state machine 601 is initialized to a start state. When a sector is to be scanned for defects, state machine 601 transitions to a CR scan state to scan for critical defects. CR mask 608 is set to select the defect information to be considered as possible candidates for critical defective symbols (or other groupings in other embodiments), which is then passed to state machine 601. The defect scan being performed during this period may be on the preamble and sync mark fields. As noted above, in one embodiment, the granularity is set for a particular symbol size, so that multiple symbols are scanned are for each sector. Each time a defect input is noted by state machine 601, a count of defects is noted in CR defect counter 605. In one embodiment, CR defect counter 605 is incremented with each noted defect input. A critical defect limit is set by a DFCT_LMT_CR value. In the shown example, DFCT_LMT_CR is stored in register 603, which is programmable. State machine 601 uses the DFCT_LMT_CR value as the upper limit for the number of symbols with non-masked defects when preamble and sync mark fields are scanned. Thus, when CR defect counter 605 reaches (or exceeds in some embodiments) the limit set by DFCT_LMT_CR, an unacceptable condition is signaled from counter 605. In some instances DFCT_LMT_CR may be set to zero.

After scanning the preamble and sync mark fields of each data sector region, the user data fields are scanned. When scanning for defects in the user data fields, state machine 601 transitions to a NC scan state to scan for non-critical defects. NC mask 607 is now set to select the defect information to be considered as possible candidates for non-critical defective symbols, which is then passed to state machine 601. Each time a defect input is noted by state machine 601, a count of defects is noted in NC defect counter 604. In one embodiment, NC defect counter 604 is incremented with each noted defect input. A non-critical defect limit is set by a DFCT_LMT_NC value. In the shown example, DFCT_LMT_NC is stored in register 602, which is also programmable. State machine 601 uses the DFCT_LMT_NC value as the upper limit for the number of defects when user data fields are scanned. Thus, when NC defect counter 604 reaches (or exceeds in some embodiments) the limit set by DFCT_LMT_NC, an unacceptable condition is signaled from counter 604 and defect information is generated and sent to the controller, per defective sector, in place of the user data. In one embodiment, this defective information sent is in packet form. As noted above, due to the programmable registers, the two limit values may be changed by programming.

The differentiation of defect analysis between sync mark/preamble fields and user data fields during defect scan allows different criteria to be set for defect analysis. As noted earlier, user data fields tend to tolerate more defects as compared to sync mark/preamble fields. Thus, sync mark/preamble fields are regarded as critical regions as compared to user data fields, which are defined as non-critical regions. Although the defect detection being performed by defect detection module 300 is the same, the analysis of the noted errors detected may be differentiated in defect scan module 504 by use of one or more masks.

With the embodiment of module 600, masks 607 and 608 are used to mask respective portions of sync mark/preamble filed and user data field during the defect scan process. The defect signals coupled to the state machine by the masks 607, 608 sets an upper limit tolerated for the sync mark/preamble fields and the data fields. Generally, more defects are tolerated in the data fields, so that the DFCT_LMT_NC value is higher than the DFCT_LMT_CR value. The DFCT_LMT_CR limit may be set to zero in some instances. Thus, separate defect limits may be established during the defect scan for the sync mark/preamble fields and the user data fields for a given sector.

As noted in FIG. 6, a multiplexer (mux) 606 is used to select between the outputs from counters 604 and 605 to generate a defect scan data (which may be in packet form) on DSCAN_DATA line or bus 620. Furthermore, in some embodiments, a sector counter 610 may be included within module 600 to maintain count of the sectors and this sector count may also be coupled through mux 606.

Figure 7A:
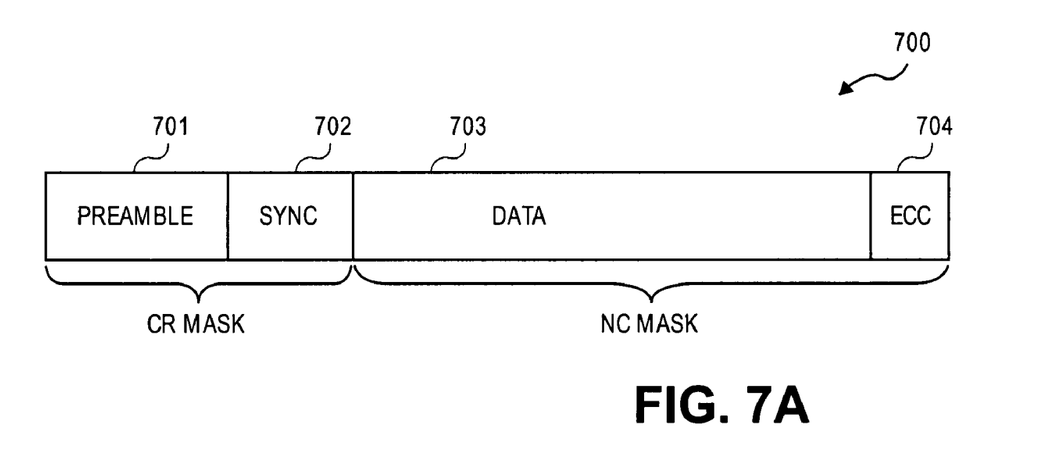
FIG. 7A shows one technique of masking a sync mark/preamble field differently from a user data field.

FIG. 7A illustrates one example of providing different scan analysis. A sector information 700 read from a disk includes a preamble field 701, sync mark field 702 and user data field 703. An ECC field 704 may be included in some instances. Sector information 700 may pertain to a portion of the disk, such as a sector or track of a disk or some other divided portion. Accordingly, in one embodiment, various fields 701-704 may correspond to those like fields 804-807 of FIG. 8. The CR mask is employed during defect scan of the preamble and sync mark fields 701, 702. The NC mask is employed during defect scan of the data field 703. Accordingly, the CR mask permits one set of parameters to be weighed in determining what is unacceptable by means of contributing errors and occurrences in way of defects for the critical region that would relegate the particular sector, track or other division to be placed as an entry in the defects table. Similarly, the NC mask permits a second set of parameters to be weighed in determining what is unacceptable in way of defects for the non-critical region that would relegate the particular sector, track or other division to be placed as an entry in the defects table.

Figure 7B:
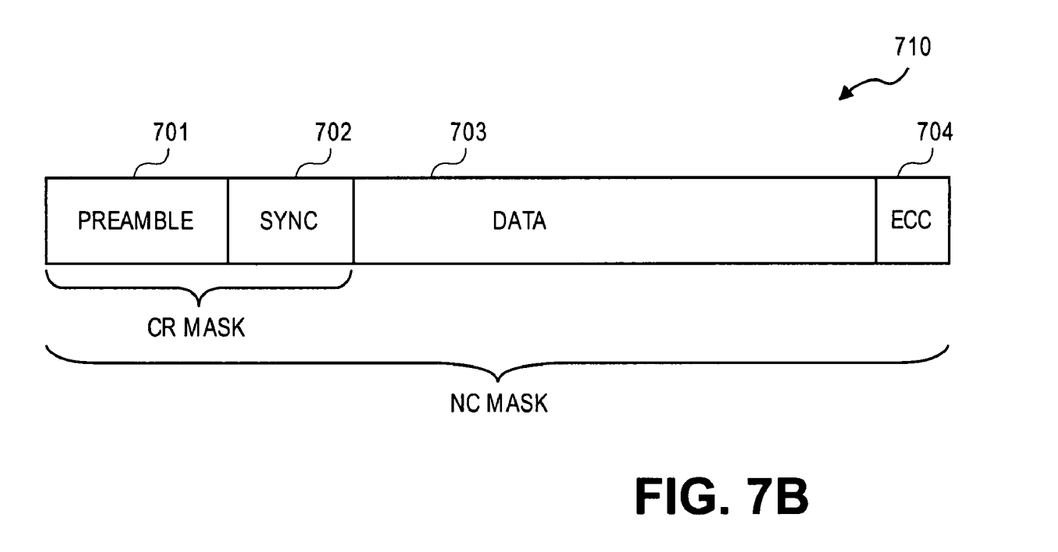
FIG. 7B shows another technique of masking a sync mark/preamble field differently from a user data field.

Although the above-described embodiments uses two separate masks, other embodiments may employ a single mask. For example, in FIG. 7B, a symbol 710 is shown having the same preamble, sync mark and user data fields 701, 702, 703. A default state is the NC mask state and defect scan parameters use a default non-critical state, except when the CR mask is activated during the CR scan to scan the sync mark/preamble fields. It is to be noted that other configurations may be readily implemented. Additionally, the invention is not limited to just two states, CR and NC. Various regions of the disk may be divided into more than two regions for defect analysis. Furthermore, it is to be noted that various masking techniques may be used for providing the masks.

Thus, multiple programmable thresholds of defect sensitivity may be set to provide defect scan for various defined regions of a storage medium. As noted in the above embodiments, at least two types of regions are distinguished for defect scan analysis. The two types of regions noted above are: (1) a critical or sensitive region that includes the preamble and sync mark fields and (2) a non-sensitive region that include the remaining defect scannable space, such as between servo wedges. In order to distinguish between sensitive and non-sensitive disk regions, in one embodiment, the disk controller uses format information based on a zone frame table or calculated frame field boundaries. With this information it selects the appropriate mask based on the location of the head between servo wedges.

By using a masking technique, a sensitive region containing the preamble and sync mark may be treated differently for defect scan than the non-sensitive region(s). Typically, defects may be tolerated more in user data regions, since such defects may be corrected with error correction schemes, such as ECC (error correction code). By treating sensitive regions of the scannable disk space differently than non-sensitive regions, defect scans may be modified to mask certain regions on a medium for different defect detection analysis.

Thus, a modified defect scan over sync mark/preamble field is described.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items.

Furthermore, the term "module" is used herein to describe a functional block and may represent hardware, software, firmware, etc., without limitation to its structure. A "module" may be a circuit, integrated circuit chip or chips, assembly or other component configurations. Accordingly, a "processing module" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions and such processing device may have accompanying memory. A "module" may also be software or software operating in conjunction with hardware.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. Similarly, flow diagram blocks and methods of practicing the embodiments of the invention may also have been arbitrarily defined herein to illustrate certain significant functionality. To the extent used, the flow diagram block boundaries and methods could have been defined otherwise and still perform the certain significant functionality. Such alternate definitions of functional building blocks, flow diagram blocks and methods are thus within the scope and spirit of the claimed embodiments of the invention. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

We claim:

1. An apparatus comprising:
    a defect detection module to detect defects when reading information stored on a storage medium; and
    a defect scan module coupled to receive defects detected in the defect detection module and to process the defects associated with a first region of the read information differently from defects associated with a second region of the read information to scan for defective portions of the storage medium;
    wherein the defect scan module processes defects detected in the first region as more critical defects than defects detected in the second region,
    wherein the first region is differentiated from the second region by use of a mask,
    wherein the first region includes a preamble field and a sync mark field and the second region includes a user data field.

2. The apparatus of claim 1, wherein the defects detected are defects that cause dropin and dropout effects on a magnetic disk medium.

3. The apparatus of claim 1, wherein the preamble, sync mark and user data fields pertain to a sector of a magnetic disk.

4. An apparatus comprising:
    a defect detection module to detect defects when reading a defect scan pattern stored on a disk; and
    a defect scan module coupled to receive defects detected in the defect detection module and to process the defects associated with a first region of a read symbol differently from defects associated with a second region of the read symbol to scan for defective sectors of the disk;
    wherein the defect scan module processes defects detected in the first region as more critical defects than defects detected in the second region,
    wherein the first region is differentiated from the second region by use of a mask,
    wherein the first region includes a preamble field and a sync mark field and the second region includes a user data field.

5. The apparatus of claim 4, wherein the defects detected are defects that cause dropin and dropout effects on a magnetic disk.

6. The apparatus of claim 4, wherein the defect scan module includes a critical defect limit value to set a number of defects permitted for the first region.

7. The apparatus of claim 6, wherein the defect scan module includes a non-critical defect limit value to set a number of defects permitted for the second region.

8. The apparatus of claim 7, wherein the defect scan module includes programmable registers to store the critical defect limit value and the non-critical defect limit value and in which one or both of the defect limit values is programmable.

9. The apparatus of claim 7, wherein the defect scan module further includes a critical defect counter and a non-critical defect counter to count critical and non-critical defects to respectively compare to the critical defect limit value and the non-critical limit value to scan for defective sectors on the disk.

10. A method comprising:
    detecting defects when reading information stored on a storage medium during a defect scan; and
    processing the defects associated with a first region of the read information differently from defects associated with a second region of the read information to scan for defective portions of the storage medium;
    wherein processing the defects includes processing defects detected in the first region as more critical defects than defects detected in the second region,
    wherein processing the critical and non-critical defects includes masking one or both of the regions to differentiate the first region from the second region for defect processing,
    wherein the first region includes a preamble field and a sync mark field and the second region includes a user data field.

* * * * *